US010396802B2

(12) United States Patent
Igarashi et al.

(10) Patent No.: US 10,396,802 B2
(45) Date of Patent: Aug. 27, 2019

(54) SEMICONDUCTOR DEVICE

(71) Applicant: Renesas Electronics Corporation, Tokyo (JP)

(72) Inventors: Mitsuhiko Igarashi, Tokyo (JP); Kan Takeuchi, Tokyo (JP); Takeshi Okagaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 19 days.

(21) Appl. No.: 15/178,817

(22) Filed: Jun. 10, 2016

(65) Prior Publication Data

US 2017/0038426 A1 Feb. 9, 2017

(30) Foreign Application Priority Data

Aug. 6, 2015 (JP) .................. 2015-155857

(51) Int. Cl.
*H03L 1/00* (2006.01)
*H03K 3/03* (2006.01)
(Continued)

(52) U.S. Cl.
CPC ............ *H03L 1/00* (2013.01); *G01R 31/2607* (2013.01); *G01R 31/275* (2013.01);
(Continued)

(58) Field of Classification Search
CPC ........ H03K 5/133; H03K 3/03; H03K 3/0315; H03K 5/19; H01L 21/822; G01R 31/26; G01R 31/2607; G01R 31/318505; H03L 1/00; H03L 7/0995; H03L 7/0992; G06F 11/3419; G11C 29/021; H03B 1/02
(Continued)

(56) References Cited

U.S. PATENT DOCUMENTS 6,288,587 B1 * 9/2001 Chen ...................... G04F 10/00
  327/261
8,400,189 B2 * 3/2013 Moon .................... H03D 13/00
  327/77
(Continued)

FOREIGN PATENT DOCUMENTS

JP  5-157799 A  6/1993
JP  11-118874 A  4/1999
(Continued)

OTHER PUBLICATIONS

Japanese Office Action issued in corresponding Japanese Patent Application No. 2015-155857, dated Feb. 5, 2019, with English Translation.

*Primary Examiner* — Arnold M Kinkead
(74) *Attorney, Agent, or Firm* — McDermott Will & Emery LLP

(57) ABSTRACT

In order to provide a semiconductor device capable of detecting HCI degradation of a semiconductor element in a simple structure, the semiconductor device includes an oscillation circuit including a plurality of logic gates of various driving forces which are formed by transistors and coupled in series, a frequency counter that measures an oscillation frequency of the oscillation circuit, and a comparator that compares the oscillation frequency of the oscillation circuit measured by the frequency counter with a predetermined value.

15 Claims, 7 Drawing Sheets

(51) Int. Cl.
*G11C 29/02* (2006.01)
*G01R 31/3185* (2006.01)
*G01R 31/26* (2014.01)
*G06F 11/34* (2006.01)
*H03L 7/099* (2006.01)
*G01R 31/27* (2006.01)
*H03K 3/011* (2006.01)
*H01L 21/822* (2006.01)
*H03B 1/02* (2006.01)
*G06F 11/07* (2006.01)
*G06F 11/00* (2006.01)

(52) U.S. Cl.
CPC .... *G01R 31/318505* (2013.01); *G06F 11/008* (2013.01); *G06F 11/076* (2013.01); *G06F 11/3419* (2013.01); *G11C 29/021* (2013.01); *H01L 21/822* (2013.01); *H03B 1/02* (2013.01); *H03K 3/011* (2013.01); *H03K 3/0315* (2013.01); *H03L 7/0995* (2013.01)

(58) Field of Classification Search
USPC .............. 331/57; 327/261, 158, 160; 702/58
See application file for complete search history.

(56) References Cited

U.S. PATENT DOCUMENTS

| | | |
|---|---|---|
| 8,519,730 B2 | 8/2013 | Miyazaki |
| 8,686,708 B2 | 4/2014 | Ishimori et al. |
| 9,128,146 B2 | 9/2015 | Yamagishi |
| 2015/0130514 A1* | 5/2015 | Lee ...................... H03B 5/1228 327/109 |

FOREIGN PATENT DOCUMENTS

| | | |
|---|---|---|
| JP | 2010-246081 A | 10/2010 |
| JP | 2011-47733 A | 3/2011 |
| JP | 2013-120836 A | 6/2013 |

* cited by examiner

SEMICONDUCTOR DEVICE

CROSS-REFERENCE TO BELATED APPLICATIONS

The disclosure of Japanese Patent Application No. 2015-155857 filed on Aug. 6, 2015 including the specification, drawings and abstract is incorporated herein by reference in its entirety.

BACKGROUND

This disclosure relates to a semiconductor device and more particularly, to a semiconductor device for detecting degradation of a semiconductor element caused by hot carrier.

In these days, semiconductor devices are being highly integrated according to a development in a micro-processing technology. A power voltage system, however, does not achieve a low voltage operation according to the miniaturization of the semiconductor devices. Therefore, field intensities of internal elements forming a semiconductor device tend to increase. Especially, in a Metal-Oxide-Semiconductor (MOS) transistor, there occurs a hot carrier phenomenon that hot carrier (hereinafter, also referred to as HCI) caused by an increase of the field intensity is injected in a gate insulation film. This hot carrier phenomenon degrades (increases) the threshold voltage of the MOS transistor.

With respect to the degradation detection of a semiconductor element, for example, Japanese Unexamined Patent Application Publication No. 2011-47733 discloses a circuit for estimating a degradation degree of a transistor in a small sized circuit. Specifically, the technique disclosed in this patent publication is to provide a circuit having a resistance between a transistor to be estimated and a power supply, for estimating the degradation of resistance divided voltage property according to the divided resistance voltage.

Japanese Unexamined Patent Application Publication No. Hei 5(1993)-157799 discloses a detection circuit of degradation of a semiconductor element by HCI. Specifically, the technique disclosed in this patent publication is to eliminate influence on an electrode terminal for estimating direct current electric characteristic and apply an alternating current stress closer to the actual circuit operation, to a transistor to be estimated.

Japanese Unexamined Patent Application Publication No. Hei 11(1999)-118874 discloses a circuit for detecting HCI degradation of a MOS transistor using a ring oscillator. Specifically, the technique disclosed in this patent publication is to detect HCI degradation by enlarging the fluctuation of oscillation frequency in a ring oscillator according to a boosting circuit.

SUMMARY

The technique disclosed in Japanese Unexamined Patent Application Publication No. 2011-47733, however, cannot predict a reliability lifetime in an environment closer to the actual circuit operation because an alternating current stress cannot be applied to a transistor to be estimated. The technique disclosed in Japanese Unexamined Patent Application Publication No. Hei 5(1993)-157799 can apply an alternating current stress to a transistor to be estimated; however, it needs 4 terminal measurement. Therefore, this technique disclosed in the above publication is difficult to be mounted into a product and to make a measurement in the filed; hence, to be restricted to for a test. The technique disclosed in Japanese Unexamined Patent Application Publication No. Hei 11(1999)-118874 is to provide a degradation detection circuit capable of simulating a logical circuit operation at a time of application of an alternating current stress. In the simple ring oscillator, however, the frequency fluctuation caused by the HCI degradation is only 1%. The technique disclosed in the above publication No. Hei 11(1999)-118874 uses the boosting circuit in order to solve the problem. The boosting circuit, however, increases the circuit area and the power consumption, and additionally it cannot reflect the operation voltage of the actual circuit.

In order to solve the above problems, in some aspect, this disclosure is to detect degradation of a semiconductor element caused by HCI in a simple structure.

Other problems and novel characteristics will be apparent from the description of the attached drawings of this specification.

A semiconductor device includes an oscillation circuit including a plurality of logic gates of various driving forces which are formed by transistors and coupled in series, a frequency counter that measures an oscillation circuit of the oscillation frequency, and a comparator that compares the oscillation frequency of the oscillation circuit measured by the frequency counter with a predetermined value.

According to a semiconductor device according to one embodiment, it is possible to detect HCI degradation of a semiconductor element in a simple structure.

DETAILED DESCRIPTION

Figure 1:
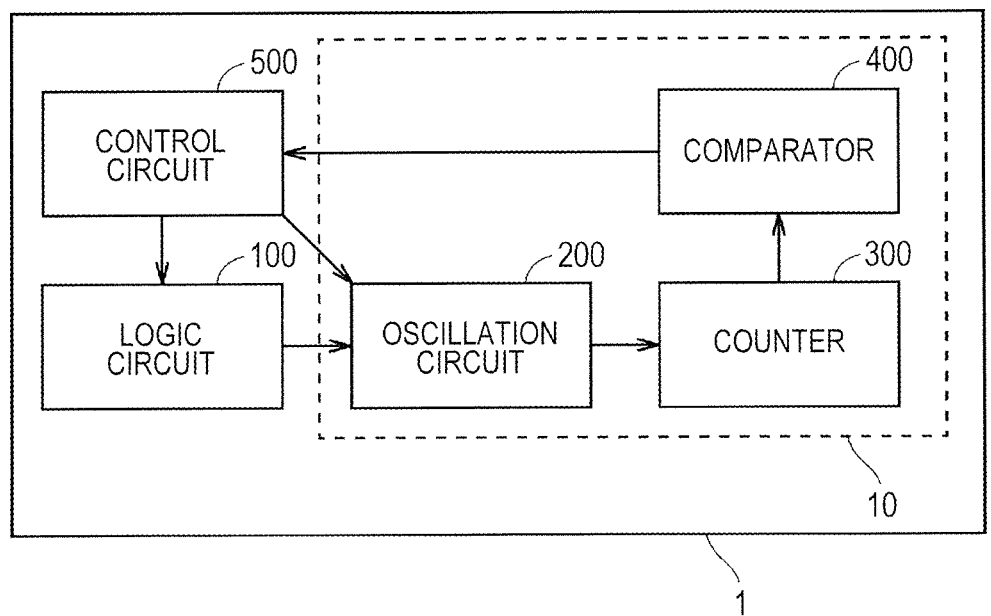
FIG. 1 is a view for use in describing the structure of a semiconductor device 1.

Hereinafter, embodiments of the invention will be described in detail with reference to the drawings. The same reference codes are attached to the same or corresponding portions in the drawings and their repeated description is omitted.

FIG. 1 is a view for use in describing the structure of a semiconductor device 1.

As shown in FIG. 1, the semiconductor device 1 includes a logic circuit 100, a control circuit 500, and a detection circuit 10. The logic circuit 100 performs a predetermined logic operation according to an instruction from the control circuit 500. The control circuit 500 controls the whole semiconductor device 1. The detection circuit 10 detects degradation caused by HCI of a semiconductor element in the semiconductor device 1.

The detection circuit 10 includes an oscillation circuit 200, a counter 300, and a comparator 400.

In this example, the case of using a ring oscillator, by way of example, for the oscillation circuit 200 will be described. The oscillation circuit 200 is formed by the odd number of logic gates, to oscillate. The counter 300 counts the input of oscillation signals from the oscillation circuit 200 and measures the oscillation frequency of the oscillation circuit 200. The comparator 400 compares the oscillation frequency of the oscillation circuit 200 output by the counter 300 with a predetermined value. Assume that the initial value (predetermined value) of the oscillation frequency of the oscillation circuit 200 is previously stored in the comparator 400. For example, it may be stored in a non-volatile memory (not illustrated). When a difference between the predetermined value and the value of the oscillation frequency of the oscillation circuit 200 becomes a predetermined value, the comparator 400 outputs the result to the control circuit 500. Upon receipt of the result from the comparator 400, the control circuit 500 determines the lifetime degradation of the semiconductor device 1.

The control circuit 500 is coupled to the logic circuit 100 and the oscillation circuit 200. The control circuit 500 controls the oscillation of the oscillation circuit 200. The control circuit 500 outputs an alarm indicating that it reaches the lifetime of the semiconductor device 1 to a display (not illustrated), according to a signal (a signal indicating that the oscillation frequency of the oscillation circuit 200 is lower than a predetermined value) based on the comparison result from the comparator 400. In another aspect, the control circuit 500 may be included in the detection circuit 10 or the logic circuit 100.

According to the circuit operation of the oscillation circuit 200, a transistor forming the oscillation circuit 200 is degraded by HCI and reduced in the operation speed. Therefore, the oscillation frequency of the oscillation circuit 200 is reduced.

Figure 2:
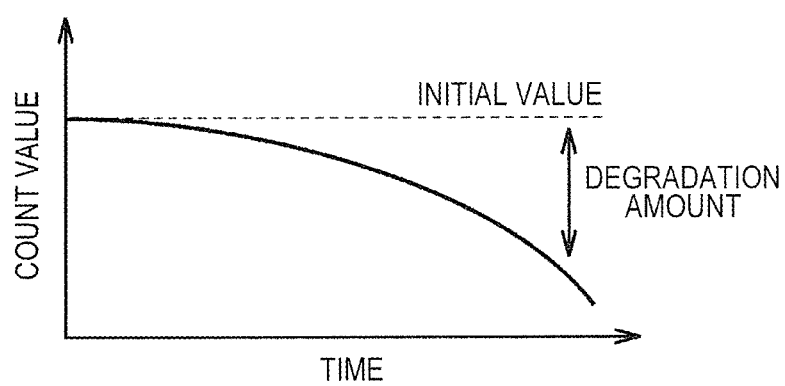
FIG. 2 is a view showing a temporal change of oscillation frequency in an oscillation circuit.

FIG. 2 is a view showing a temporal change of the oscillation frequency in the oscillation circuit.

As shown in FIG. 2, while the circuit of the oscillation circuit 200 is operating, the oscillation frequency of the oscillation circuit 200 is reduced. Accordingly, the detection circuit 10 can determine the degradation degree of the transistor forming the oscillation circuit 200 by comparison between the oscillation frequency of the oscillation circuit 200 and the initial value (predetermined value).

The detection circuit 10 may determine the degradation degree of the transistor forming the logic circuit 100, by designing the oscillation circuit 200 to operate only during the operation of the logic circuit 100.

[HCI Degradation Detection in Conventional Oscillation Circuit]

Figure 3:
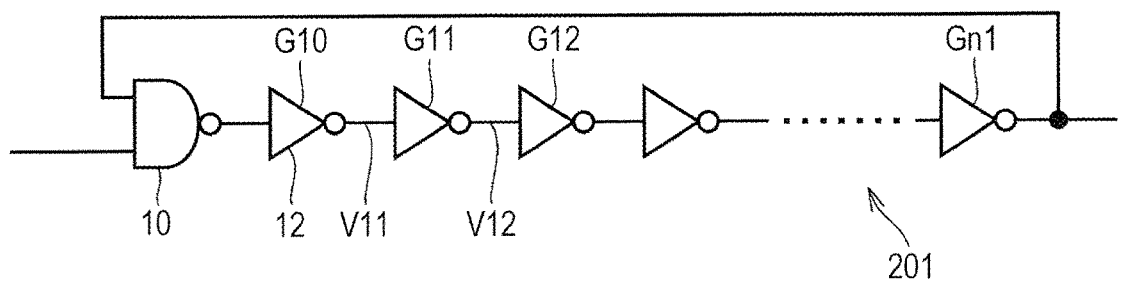
FIG. 3 is a view showing the constitutional example of a conventional oscillation circuit (ring oscillator).

FIG. 3 is a view showing the constitutional example of the conventional oscillation circuit (ring oscillator). With reference to FIG. 3, the oscillation circuit 201 includes a NAND gate 10 and the even number of inverters G10, G11, G12, . . . , and Gn1.

The driving force is equal among the inverters G10 to Gn1. As one input, the NAND gate 10 receives a signal from an output node of the inverter Gn1 in the final stage in the oscillation circuit 201. As the other input, the NAND gate 10 receives a control signal from the control circuit 500 through the logic circuit 100. The control circuit 500 can control whether the oscillation circuit 201 is oscillated or not according to the control signal.

Figure 4:
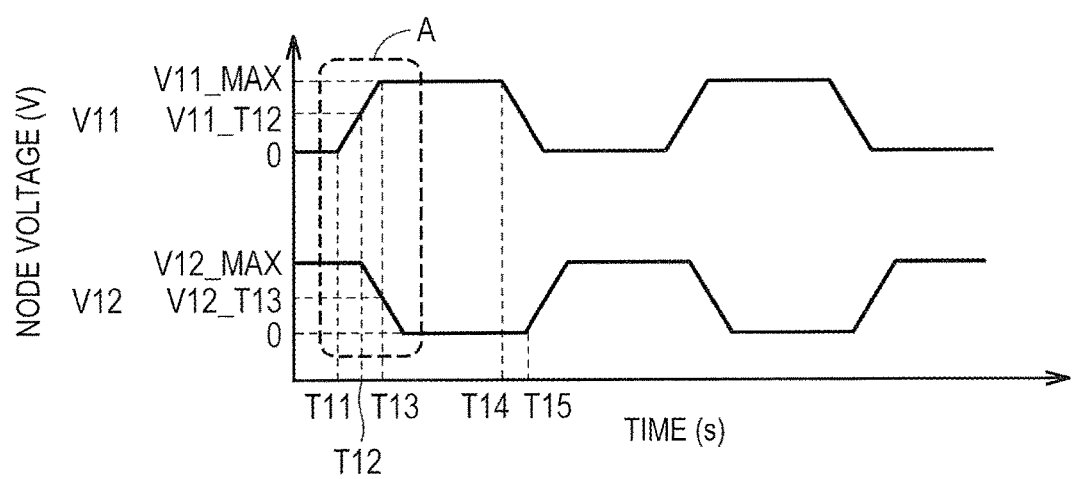
FIG. 4 is a view for use in describing a temporal change of each node voltage in the oscillation circuit shown in FIG. 3.

FIG. 4 is a view for use in describing a temporal change of each node voltage in the oscillation circuit shown in FIG. 3. Hereinafter, the unit [V] of a voltage may be occasionally omitted.

At the time T11, upon receipt of the output signal of a node voltage V11 from the inverter G10 at the input side, the node voltage V11 starts switching from 0 (Low) gradually to V11_MAX (High). After elapse of a predetermined time, at the time T14, upon receipt of the output signal from the inverter G10 at the input side, the node voltage V11 starts switching from High gradually to Low. Switching of the node voltage V11 from High to Low or from Low to High is not performed instantly but gradually performed with a delay.

At the time T12, the node voltage V12 starts switching from V12_MAX (High) gradually to 0 (Low) with a delay from the time T11. At the time T15 after elapse of the predetermined time, the node voltage V12 starts switching from Low gradually to High.

When the node voltage at the input side of the inverter and the node voltage at the output side thereof are both high, the transistor forming the inverter is most degraded by HCI. For example, in the case of an NMOS transistor, the node voltage at the input side corresponds to Vgs (voltage between gate and source) and the node voltage at the output side corresponds to Vds (voltage between drain and source).

When the node voltage V11 at the input side and the node voltage V12 at the output side are both high, the HCI degradation of the inverter G11 proceeds. Therefore, the HCI degradation of the inverter G11 occurs in the time area A where the inverter G11 performs the switching operation.

At the time T12, the node voltage of the inverter G11 at the output side is the maximum V12_MAX. On the other hand, the node voltage V11_T12 at the input side stays in a middle level between 0 and V11_MAX. At the time T12, the HCI degradation of the inverter G11 is small.

At the time T13, the node voltage of the inverter G11 at the input side is the maximum V11_MAX. On the other hand, the node voltage V12_T13 at the output side stays in a middle level between 0 and V12_MAX. Also at the time T13, the HCI degradation of the inverter G11 is small.

As mentioned above, in the conventional oscillation circuit 201, the HCI degradation of the inverter is small in every switching operation (temporal area A). Even at a point of degradation of the transistor to a problem level from the viewpoint of reliability, a fluctuation of the oscillation frequency in FIG. 2 is about 1%. Accordingly, in the conventional oscillation circuit 201, the sensibility to the HCI degradation of the transistor (HCI degradation amount per unit time) is low.

[First Embodiment]

Figure 5:
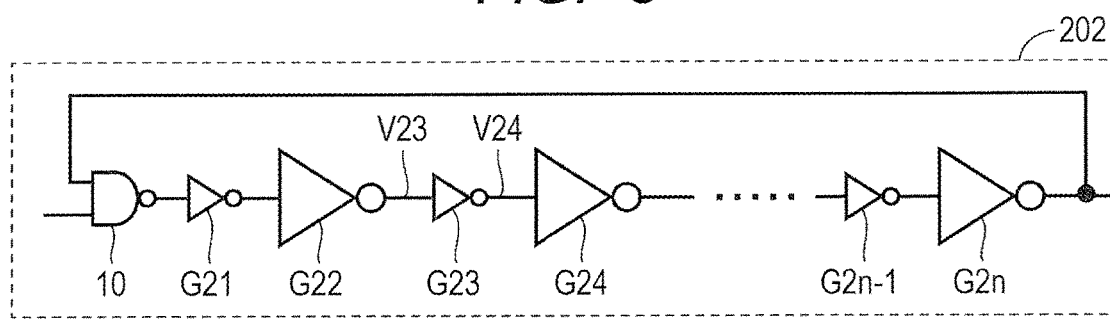
FIG. 5 is a view showing the constitutional example of an oscillation circuit according to a first embodiment.

FIG. 5 is a view showing the constitutional example of an oscillation circuit according to a first embodiment. With reference to FIG. 5, the oscillation circuit 202 includes a NAND gate 10, inverters G21, G23, . . . , and G2n−1 of a small driving force, and inverters G22, G24, . . . , and G2n of a large driving force in series. The driving force of the inverter fluctuates according to the transistor forming the inverter. Specifically, according as the gate length of the transistor is shorter and the gate width is longer, the driving force of the inverter gets larger.

In the oscillation circuit 202, the inverters of a small driving force may be replaced with the inverters of a large driving force.

The logic gate forming the oscillation circuit 202 may be formed by a NAND gate or a NOR gate, instead of the inverter.

When using the NAND gate, as one input, the NAND gate receives an output from the NAND gate in the former stage. As the other input, the NAND gate is coupled to the common power line, to receive an input of High.

When using the NOR gate, as one input, the NOR gate receives an output from the NOR gate in the former stage. As the other input, the NOR gate is coupled to the common GND line, to receive an input of Low.

An example of the logic gate forming the oscillation circuit can be also applied to the oscillation circuit shown in the following example.

Figure 6:
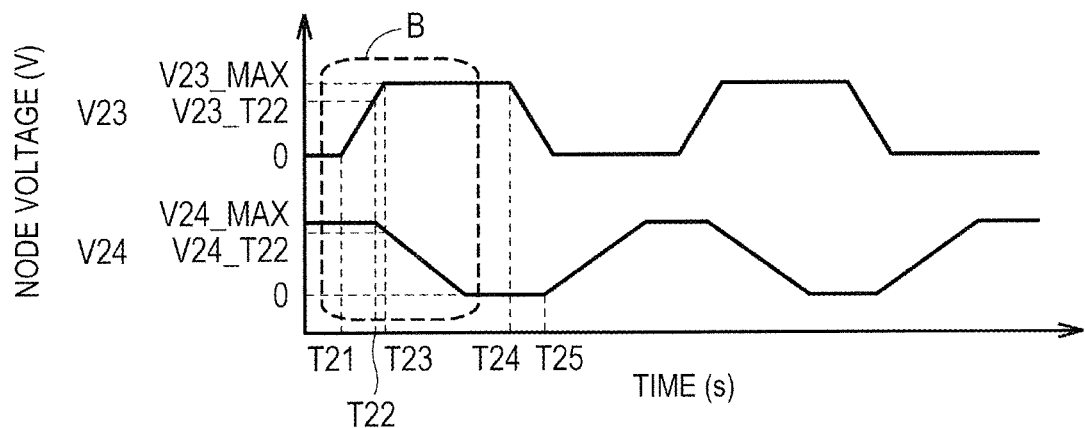
FIG. 6 is a view for use in describing a temporal change of each node voltage in the oscillation circuit shown in FIG. 5.

FIG. 6 is a view for use in describing a temporal change of each node voltage of the oscillation circuit shown in FIG. 5.

At the time T21, upon receipt of an output signal from the inverter G22 at the input side, the node voltage V23 starts switching (rising) from 0 (Low) gradually to V23_MAX (High). After elapse of a predetermined time, at the time T24, upon receipt of the output signal from the inverter G22 at the input side, the node voltage V23 starts switching from High gradually to Low (falling).

The rising or falling of the node voltage V23 is sharper than the rising or falling of the node voltage of the conventional oscillation circuit 201 (for example, V11 shown in FIG. 4). This is because the inverter G22 of a large driving force drives the inverter G23 of a small driving force.

At the time T22, the node voltage V24 starts falling from V24_MAX (High) gradually to 0 (Low). After elapse of a predetermined time, at the time T25, the node voltage starts rising from Low gradually to High.

The rising or falling of the node voltage V24 is more gradual than the rising or falling of the node voltage of the conventional oscillation circuit 201. This is because the inverter G23 of a small driving force drives the inverter G24 of a large driving force.

At the time T22, the node voltage of the inverter G23 a the output side is the maximum value V24_MAX. On the other hand, the node voltage V23_T22 of the inverter G23 at the input side becomes a value closer to V23_MAX. The node voltage V23_T22 is higher than the node voltage V11_T12 of the corresponding conventional oscillation circuit 201. This is because the rising of the node voltage V23 is sharper than the rising of the node voltage of the conventional oscillation circuit 201. Therefore, at the time T22, the HCI degradation of the inverter G23 is larger than the HCI degradation of the inverter (for example, the inverter G11) of the conventional oscillation circuit 201 at the corresponding time T12.

At the time T23, the node voltage of the inverter G23 at the input side is the maximum value V23_MAX. On the other hand, the node voltage V24_T23 of the inverter G23 at the output side becomes a value closer to V24_MAX. The node voltage V24_T23 is higher than the corresponding node voltage V12_T13 of the conventional oscillation circuit 201. This is because the falling of the node voltage V24 is more gradual than the falling of the node voltage of the conventional oscillation circuit 201. Therefore, at the time T23, the HCI degradation of the inverter G23 is larger than the HCI degradation of the inverter of the conventional oscillation circuit 201 at the corresponding time T13.

By arranging the inverter of a large driving force in the former stage and the latter stage of the inverter of a small driving force, the HCI degradation of the inverter of a small driving force gets larger than the HCI degradation in the conventional oscillation circuit 201, in every switching operation (temporal area B). Therefore, the oscillation circuit according to the first embodiment has a higher sensibility to the HCI degradation than the conventional oscillation circuit.

Although in the oscillation circuit 202, the inverters of a small driving force and the inverters of a large driving force are alternately arranged, the inverters of a large driving force may be arranged in the former stage and the latter stage of the inverter of a small driving force in a part of the oscillation circuit 202.

In the oscillation circuit 202, each driving force of the inverters G21, G23, . . . , and G2n−1 may be identical or various. Similarly, each driving force of the inverters G22, G24, . . . , and G2n may be identical or various.

By using the oscillation circuit 202 according to the first embodiment, as the oscillation circuit 200 shown in FIG. 1, it is possible to detect the HCI degradation of the transistor forming the logic circuit 100 with a higher sensibility.

Further, the detection circuit 10 using the oscillation circuit 202 according to the first embodiment can detect the HCI degradation through two terminal measurement, which makes the installation into a product and the measurement in a field easy. Additionally, the detection circuit 10 using the oscillation circuit 202 according to the first embodiment is not configured to use a boosting circuit, which makes it possible to suppress the power consumption and realize an actual operation of the logic circuit 100.

Figure 7:
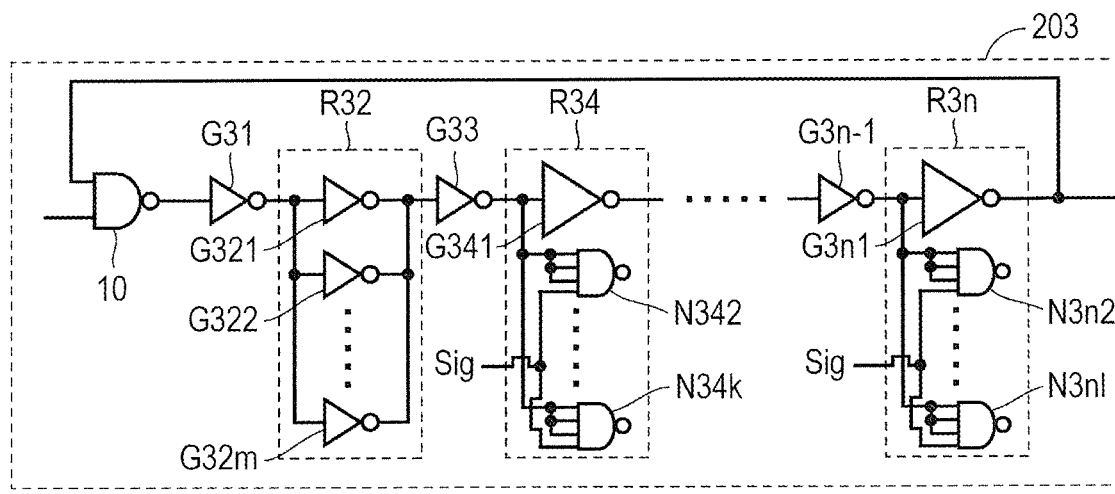
FIG. 7 is a view showing the constitutional example of an oscillation circuit according to a modified example of the first embodiment.

Next, with reference to FIG. 7, a modified example according to the first embodiment will be described. FIG. 7 is a view showing the constitutional example of the oscillation circuit according to the modified example of the first embodiment. With reference to FIG. 7, the oscillation circuit 203 includes a NAND gate 10, inverters G31, G33, . . . , and G3n−1, and logic gate groups R32, R34, . . . , and R3n having a plurality of logic gates coupled in parallel, at least including one inverter.

The logic gate group R32 includes m pieces of the inverters coupled in parallel. The logic gate group R34 includes an inverter G341 and a plurality of 4-input NAND gates N342, . . . , and N34k coupled in parallel; that is, k pieces of logic gates in total. Three input terminals of each of the 4-input NAND gates N342, . . . , and N34k receive an output from the inverter in the former stage. One remaining input terminal receives a control signal Sig output from the control circuit 500.

In the embodiment, the 4-input NAND gates N342, . . . , and N34k forming the logic gate group R34 are opened at their output sides. The reason why these NAND gates are coupled in parallel is to enlarge the total capacity of the logic gate group R34. Therefore, the output sides of these NAND gates may be opened or may be coupled to the inverter G35 in the next stage.

When the output sides of these NAND gates are coupled to the G35 in the next stage, each of the NAND gates N342, . . . , and N34k receives a control signal Sig of High output from the control circuit 500.

The outputs from the respective inverters G321, G322, . . . , and G32n forming the logic gate group R32 are coupled to one inverter G33. Therefore, the fan-out number of each inverter forming the logic gate group R32 is 1. The "fan-out number" means the number of the logic gates to which the output from the logic gates is coupled. The output from the inverter G33 is coupled to the k pieces of the logic gates forming the logic gate group R34; therefore, the fan-out number of the inverter G33 is k.

Each capacity of the logic gate groups R32, R34, ..., and R3n increases in proportion to the number of the logic gates coupled in parallel. The driving force of the logic gate is in proportion to the capacity of the transistor forming the corresponding logic gate. Therefore, the inverters G31, G33, ..., and Gn3-1 correspond to the inverter of a small driving force. On the other hand, the logic gate groups R32, R34, ..., and R3n including the inverters correspond to the inverter of a large driving force.

Therefore, even when using the oscillation circuit 203 in which the logic gates of different fan-out number are alternately arranged, instead of the oscillation circuit 202 in which the logic gates of different driving force are alternately arranged, the same effect as the oscillation circuit 202 can be obtained.

Although in the oscillation circuit 203, the logic gates of different fan-out number are alternately arranged, the structure of the oscillation circuit 203 is not restricted to the illustrated structure. At least, a part of the oscillation circuit 203 has only to include such a structure as having a logic gate group of a small fan-out number in the stages before and after the inverter of a large fan-out number. Accordingly, the fan-out number of each inverter included in the logic gate groups R32, R34, ..., and R3n is not restricted to 1 but has only to be smaller than the fan-out number of each inverter G31, G33, ..., and G3n-1.

Further, the number of the inverters coupled to the logic gate groups R32, R34, ..., and R3n in parallel may be identical or various. The driving force of each logic gate forming each logic gate group may be identical or various.

Preferably, each logic gate forming each logic gate group has a larger driving force than each of the inverters G31, G33, ..., and G3n-1. This is because the driving force ratio between the logic gate group and the inverter in the former stage or the latter stage can be enlarged. As the result, the HCI degradation increases in every switching operation of the inverter of a small driving force.

In the embodiment, in order to enlarge the driving force ratio, inverters of a larger driving force than the inverters G31, G33, ..., and G3n-1 are used, like the inverters G341, ..., and G34n. In order to enlarge the driving force ratio, the 4-input NAND gates are used. This is because the NAND gate including a lot of input terminals has more capacity (driving force) as for the area, rather than the NAND gate including a small number of input terminals. Therefore, in order to enlarge the driving force ratio, 3 input or more NAND gate is preferable rather than 2-input NAND gate.

In another aspect, not the NAND gate but the NOR gate may be used to obtain the same effect. In the case of using the NOR gate, at least one input terminal of the NOR gate receives the control signal Sig of Low output from the control circuit 500.

Figure 8:
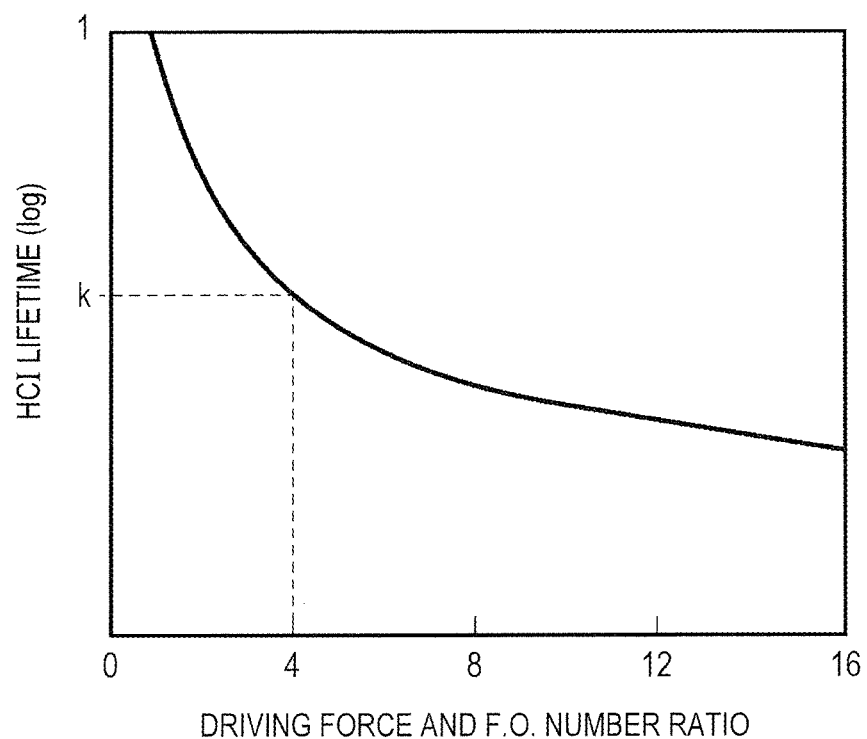
FIG. 8 is a view for use in describing a hot carrier lifetime as for a ratio of the driving force and the number of fan-out in a logic gate.

FIG. 8 is a view for use in describing a hot carrier lifetime as for a ratio of the driving force and the fan-out number in a logic gate.

The driving force ratio means the rate of the driving force of each inverter G22, G24, ..., and G2n as for the driving force of each inverter G21, G23, ..., and G2n-1 in the oscillation circuit 202 shown in FIG. 5. The ratio of the fan-out number means the number of the logic gates to which the output of each G31, G33, ..., and G3n-1 is coupled, in the oscillation circuit 203 shown in FIG. 7. The hot carrier lifetime means the time when the HCI degradation of the transistor arrives at a predetermined amount. In this embodiment, the predetermined amount means 1% decrease of the oscillation frequency from the initial value in the oscillation circuit. In FIG. 8, the hot carrier lifetime is plotted on a vertical axis in a log scale.

According as the driving force ratio increases or the ratio of the fun-out number increases, the hot carrier lifetime gets shorter. When the hot carrier lifetime is defined as 1 in the case of using the conventional oscillation circuit 201, the hot carrier lifetime gets 1/k times by increasing the driving force ratio by four or increasing the fan-outnumber ratio by four. Therefore, by increasing the driving force ratio and increasing the fan-out number ratio, it is possible to enhance the sensibility to the HCI degradation in a transistor forming the oscillation circuit.

[Second Embodiment]

Figure 9:
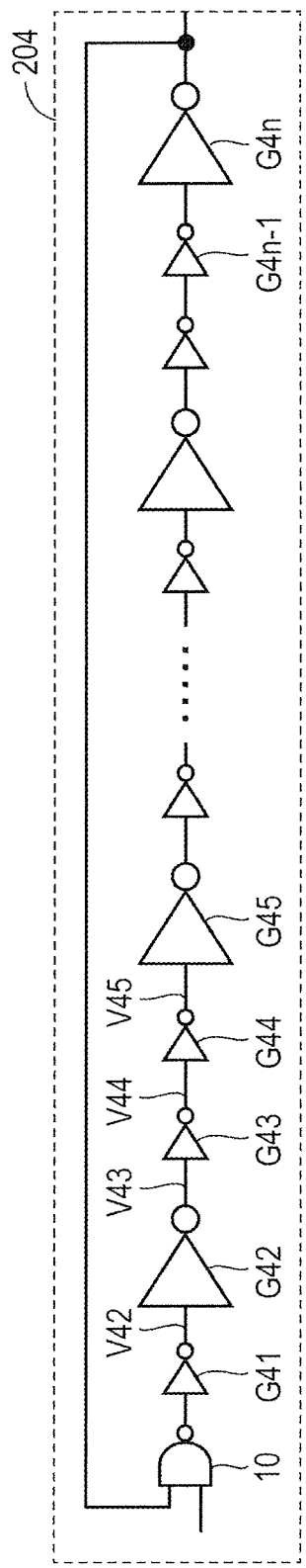
FIG. 9 is a view showing the constitutional example of an oscillation circuit according to a second embodiment.

FIG. 9 is a view showing the constitutional example of an oscillation circuit according to a second embodiment. With reference to FIG. 9, the oscillation circuit 204 includes a NAND gate 10, inverters of a small driving force G41, G43, G44, ..., and G4n-1, and inverters of a large driving force G42, G45, ..., and G4n. As shown in FIG. 9, in the oscillation circuit 204, a combination of two inverters of a small driving force and one inverter of a large driving force is repeatedly arranged.

Figure 10:
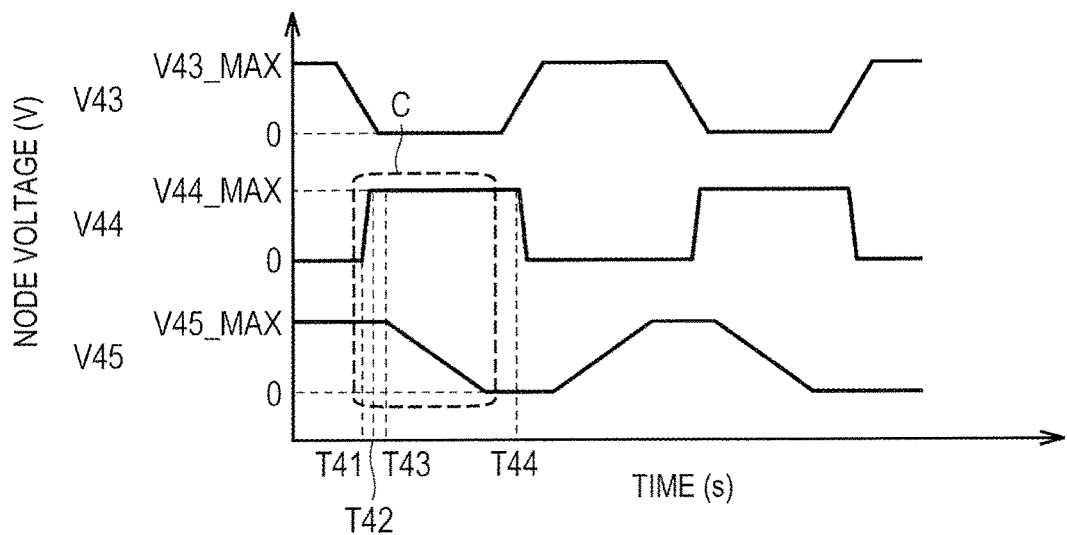
FIG. 10 is a view for use in describing a temporal change of each node voltage in the oscillation circuit shown in FIG. 9.

FIG. 10 is a view for use in describing a temporal change of each node voltage in the oscillation circuit shown in FIG. 9. Since the node voltages V43 and V45 are respectively similar to the node voltages V23 and V24 in FIG. 6, their detail is not described here.

At the time T41, the node voltage V44 starts rising from 0 (Low) to V44_MAX (High). After elapse of a predetermined time, at the time T44, the node voltage V44 starts falling from High to Low.

As the characteristic of a transistor forming a logic gate, the node voltage at the output side of the logic gate is affected by the node voltage at the input side. For example, when a temporal change (inclination) of the node voltage at the input side of a logic gate is gradual, the inclination of the node voltage at the output side gets a little gradual.

In the inverter G42, the inclination of the node voltage V43 at the output side is sharper than that of the node voltage in the conventional oscillation circuit 201. However, since the inclination of the node voltage V42 at the input side of the inverter G42 is gradual, the inclination of the node voltage V43 is a little gradual.

In the inverter G43, the inclination of the node voltage V43 at the input side is sharp. Further, since the inverter G44 in the next stage has a small driving force (small capacity), the inclination of the node voltage V44 at the output side of the inverter G43 becomes sharp. The node voltage V44 at the output side is affected by the node voltage V43 at the input side having a sharp inclination. Therefore, the inclination of the node voltage V44 is sharper than that of the node voltage V43.

At the time T42 to T43, the node voltage at the input side of the inverter G44 is the maximum value V44_MAX. Further, the node voltage at the output side of the inverter G44 is the maximum value V45_MAX. Therefore, at the time T42 to T43, the HCI degradation of the transistor forming the inverter G44 becomes the maximum. As the result, at the time T42 to T43, the HCI degradation of the inverter G44 is greater than the HCI degradation of the inverter G23 at the corresponding time T22 to T23 in the first embodiment.

In FIG. 10, although the combination of the two inverters of a small driving force and the one inverter of a large driving force is repeatedly arranged, the structure of the oscillation circuit 204 is not restricted to this. Specifically, at least a part of the oscillation circuit 204 has only to include such an arrangement structure as: an inverter of a large driving force in the first stage, inverters of a small driving force in the second and third stages, and an inverter of a large driving force in the fourth stage, in this order (hereinafter, referred to as a structure according to the second embodiment).

Since the oscillation circuit 204 includes the structure according to the second embodiment, the HCI degradation of the inverter (for example, the inverter G43) arranged in the third stage in this structure in every switching operation (temporal area C) is larger than the HCI degradation of the inverter according to the first embodiment.

In the oscillation circuit 204, each driving force of the inverters G41, G43, G44, ..., and G4n−1 may be identical or various. Similarly, each driving force of the inverters G42, G45, ..., and G4n may be identical or various. Where, the driving force of the inverter (for example, the inverter G43) in the second stage in the structure according to the second embodiment is more than the driving force of the inverter (for example, the inverter G44) in the third stage in this structure.

In another aspect, instead of the inverters G42, G45, ..., and G4n of a large driving force, the logic gate groups R32, R34, ..., and R3n including inverters as shown in FIG. 7 may be used.

As the oscillation circuit 200 shown in FIG. 1, the oscillation circuit 204 according to the second embodiment is used, which makes it possible to detect the HCI degradation of a transistor forming the logic circuit 100 with a higher sensibility.

Further, a detection circuit 10 using the oscillation circuit 204 according to the second embodiment can detect the HCI degradation by two-terminal measurement, which makes the installation into a product and the measurement in a field easy. Additionally, the detection circuit 10 using the oscillation circuit 204 according to the second embodiment does not use a boosting circuit, which makes it possible to suppress the power consumption and realize an actual operation of the logic circuit 100.

[Third Embodiment]

Figure 11:
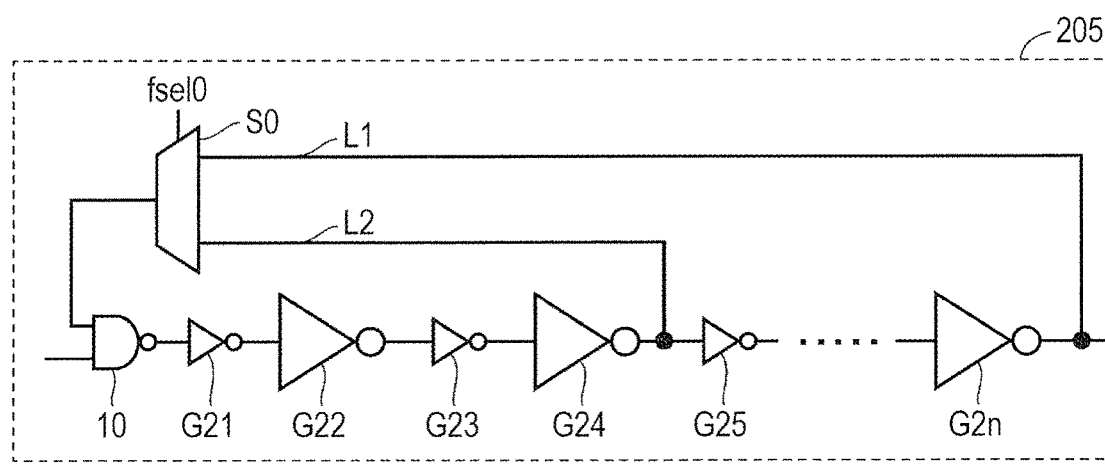
FIG. 11 is a view showing the constitutional example of an oscillation circuit according to a third embodiment.

FIG. 11 is a view showing the constitutional example of an oscillation circuit according to a third embodiment. With reference to FIG. 11, the oscillation circuit 205 is an oscillation circuit with a selector S0 added to the oscillation circuit 202 shown in FIG. 5. The other portions are the same as those of the oscillation circuit 202; therefore, the description of the same portions will not be repeated.

As shown in FIG. 11, a node L1 that is an output from the inverter G2n in the final stage is coupled to one input terminal of the selector S0. A node L2 for coupling the inverters G24 and G25 in the middle stage is coupled to the other input terminal of the selector S0. The selector S0 selects one input of the nodes L1 and L2, according to a control signal fsel0 input from the control circuit 500.

When the selector S0 selects the node L2, the oscillation circuit 205 oscillates using the NAND gate 10 and the inverters G21 to G24. When the selector S0 selects the node L2, the number of the logic gates used for oscillation is less than that when the selector S0 selects the node L1. Oscillation period of a ring oscillator typed oscillation circuit is determined by a delay of each oscillating logic gate and the number of the stages of the oscillating logic gates. When the selector S0 selects the node L2, a delay time in total becomes short; therefore, the oscillation circuit oscillates at a high speed. Accordingly, the number of the times of switching per unit time of each inverter increases; therefore, the sensibility to the HCI degradation of the oscillation circuit 205 gets higher according as the number of the logic gates used for oscillation is less.

When the selector S0 selects the node L2, the inverters G25 to G2n in the latter stages perform the switching operation at the same frequency as the inverters G21 to G24; therefore, the HCI degradation occurs in the same way as in the inverters G21 to G24.

In this example, although the node L2 for coupling the inverters G24 and G25 is coupled to the input terminal of the selector S0, it is not restricted to this structure. The oscillation circuit 205 has only to include at least one inverter having a large HCI degradation (for example, the inverter of a small driving force interposed between the inverters of a large driving force in the first embodiment), in the inverters used for oscillation.

The HCI degradation in each inverter forming the oscillation circuit 205 is various even among the inverters having the same driving force. When detecting the HCI degradation of the oscillation circuit 205, according as the number of the inverters used for oscillation is larger, the oscillation circuit 205 can more suppress the effect from variation of the HCI degradation among the inverters. When detecting the HCI degradation of the oscillation circuit 205, the selector S0 selects the node L1 and the oscillation circuit 205 oscillates using all the logic gates forming the oscillation circuit 205.

As mentioned above, the oscillation circuit having the oscillation stage-adjustable structure can switch a stress application mode and an HCI degradation detection mode. The stress application mode means a mode of enhancing the HCI degradation sensibility through oscillation in a small number of stages. The HCI degradation detection mode means a mode of detecting HCI degradation while suppressing the effect from variation of the HCI degradation through oscillation in a large number of stages.

In this example, although the oscillation circuit 205 is included by including a selector in the oscillation circuit 202, in another aspect, the oscillation circuit 203 or the oscillation circuit 204 may include a selector and the oscillation circuit 203 or the oscillation circuit 204 may adjust the number of the stages for oscillation.

The oscillation circuit according to the third embodiment is set at the stress application mode when accelerating the HCI degradation, while it is set at the HCI degradation detection mode when detecting the HCI degradation. According to this structure, the oscillation circuit according to the third embodiment has a higher sensibility to the HCI degradation and it can suppress variation of the detection result of the HCI degradation.

Figure 12:
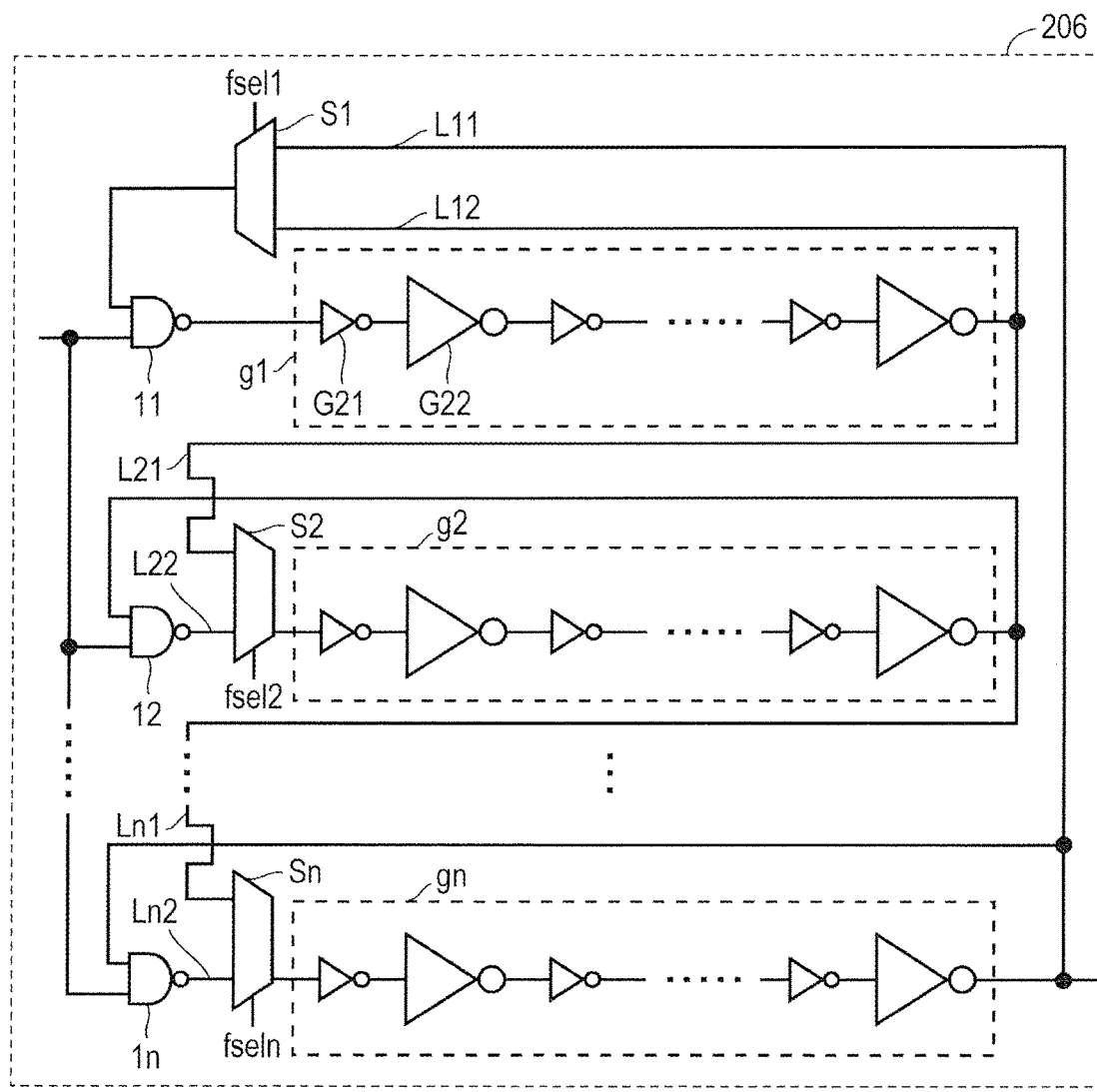
FIG. 12 is a view showing the constitutional example of an oscillation circuit according to a modified example of the third embodiment.

FIG. 12 is a view showing the constitutional example of an oscillation circuit according to a modified example of the third embodiment. Referring to FIG. 12, the oscillation circuit 206 includes NAND gates 11, 12, ..., and 1n, selectors S1, S2, ..., and Sn, and inverter groups g1, g2, and gn. Each inverter group includes the inverters G21 of a small driving force and the inverters G22 of a large driving force alternately arranged.

One input terminal of the selector S1 is coupled to the output node of the inverter in the final stage of the inverter group g1. The other input terminal of the selector S1 is coupled to the output node of the inverter in the final stage of the inverter group gn.

The respective one input terminals of the respective selectors S2, ..., and Sn are coupled to the respective output nodes of the NAND gates 12, 13, ..., and 1n. The respective other input terminals of the respective selectors S2, ..., and Sn are coupled to the respective output nodes of the respective inverters in the final stages of the respectively previous inverter groups g1, ..., and gn−1.

In the stress application mode of the oscillation circuit 206, the selectors S1, S2, ..., and Sn respectively select the nodes L12, L22, ..., and Ln2, according to the control signals fsel1, fesl2, ..., and fesln input from the control circuit 500. In the stress application mode, the oscillation circuit 206 has the NAND gate 11 and the inverter group g1, and the inverter groups g2, ..., and gn respectively oscillating individually. The oscillation frequency output by the oscillation circuit 206 to the counter 300 in the stress application mode gets equal to the oscillation frequency of the inverter group gn.

In the HCI degradation detection mode of the oscillation circuit 206, the selectors S1, S2, ..., and Sn respectively select the nodes L11, L21, ..., and Ln1, according to the control signals fsel1, fesl2, ..., and fseln input from the control circuit 500. In the HCI degradation detection mode, the oscillation circuit 206 oscillates using all the inverter groups and NAND 11.

All the control signals fsel1, fesl2, ..., and fseln are the common signal and they may be one signal output from the control circuit 500.

As mentioned above, the oscillation circuit is configured to be able to adjust the number of stages of oscillation, thereby making it possible to switch the stress application mode and the HCI degradation detection mode.

In this example, although the arrangement structure of the inverters shown in the oscillation circuit 202 is used as the structure of the respective inverter groups g1, g2, ..., and gn of the oscillation circuit 206, the arrangement structure of the inverters is not restricted to this. The arrangement structure of the inverters shown in the oscillation circuit 203 or the oscillation circuit 204 may be used.

In another aspect, instead of the inverter G22 of a large driving force, the logic gate groups R32, R34, ..., and R3n including the inverters shown in FIG. 7 may be used.

The oscillation circuit according to the modified example of the third embodiment is set at the stress application mode when accelerating the HCI degradation and set at the HCI degradation detection mode when detecting the HCI degradation. According to the structure, the sensibility to the HCI degradation of the oscillation circuit gets higher, hence to suppress the variation of the detection result of the HCI degradation.

As the oscillation circuit 200 shown in FIG. 1, by using the oscillation circuit 205 or the oscillation circuit 206 according to the third embodiment, it is possible to detect the HCI degradation of a transistor forming the logic circuit 100 with high sensitivity and high precision.

Further, since the detection circuit 10 using the oscillation circuit 205 or the oscillation circuit 206 according to the third embodiment can detect the HCI degradation with two terminal measurement, the installation into an actual product and the measurement in a field is easy. Additionally, the detection circuit 10 using the oscillation circuit 205 or the oscillation circuit 206 according to the second embodiment does not use a boosting circuit; therefore, it is possible to suppress the power consumption and realize an actual operation of the logic circuit 100.

As mentioned above, although the invention made by the inventor et al. has been described based on the embodiments, the invention is not restricted to the above embodiments but needless to say, various modifications are possible without departing from the spirit.

What is claimed is:

1. A semiconductor device comprising:
an oscillation circuit including a plurality of logic gates of various driving forces, the plurality of logic gates being formed by transistors and coupled in series;
a frequency counter that measures an oscillation frequency of the oscillation circuit;
a comparator that compares the oscillation frequency of the oscillation circuit measured by the frequency counter with a predetermined value; and
a control circuit that determines degradation of the semiconductor device based on a difference between the predetermined value and the measured oscillation frequency,
wherein the predetermined value is an initial value of the oscillation frequency measured by the frequency counter.

2. The semiconductor device according to claim 1, wherein the plurality of logic gates of the various driving forces includes:
a plurality of first logic gates of a first driving force; and
a plurality of second logic gates of a second driving force larger than the first driving force, and
wherein the first logic gates and the second logic gates are coupled in series in a predetermined pattern.

3. The semiconductor device according to claim 2, wherein the second driving force of the second logic gates is four times or more larger than the first driving force of the first logic gates.

4. The semiconductor device according to claim 2, wherein the first logic gates and the second logic gates are alternately coupled in series.

5. The semiconductor device according to claim 2, wherein the first logic gates and the second logic gates are coupled in series such that a set of the first logic gates is followed by one of the second logic gates that is followed by another set of the first logic gates.

6. The semiconductor device according to claim 1, wherein the oscillation circuit includes a select circuit that changes a number of the logic gates coupled in series.

7. The semiconductor device according to claim 2, wherein the first logic gate each includes a first transistor, and
the second logic gate each includes a second transistor with a shorter gate length than the first transistor.

8. The semiconductor device according to claim 7, wherein the second transistor has a longer gate width than the first transistor.

9. A semiconductor device comprising:
an oscillation circuit including a plurality of logic gates of various fan-out numbers, the plurality of logic gates being formed by transistors and coupled in series;
a frequency counter that measures an oscillation frequency of the oscillation circuit;
a comparator that compares the oscillation frequency of the oscillation circuit measured by the frequency counter with a predetermined value; and a control circuit that determines degradation of the semiconductor device based on a difference between the predetermined value and the measured oscillation frequency, wherein the predetermined value is an initial value of the oscillation frequency measured by the frequency counter.

10. The semiconductor device according to claim 9, wherein the oscillation circuit includes first logic gates of a first fan-out number, and second logic gates of a second fan-out number larger than the first fan-out number, wherein the first logic gates and the second logic gates are coupled in series in a predetermined pattern.

11. The semiconductor device according to claim 10, wherein the second fan-out number is four times or more larger than the first fan-out number.

12. The semiconductor device according to claim 1, wherein a first logic gate, a second logic gate and a third logic gate, among the plurality of logic gates, are arranged in series, and wherein the second logic gate is provided directly between the first logic gate and the third logic gate, and wherein the first logic gate and the third logic gate have a larger driving force than the second logic gate.

13. The semiconductor device according to claim 9, wherein a first logic gate, a second logic gate and a third logic gate, among the plurality of logic gates, are arranged in series, and wherein the second logic gate is provided directly between the first logic gate and the third logic gate, and wherein the first logic gate and the third logic gate have larger fan-out numbers than the second logic gate.

14. The semiconductor device of claim 1, wherein the control circuit determines that there is degradation of the semiconductor device when the difference between the predetermined value and the measured oscillation frequency becomes a first value.

15. The semiconductor device of claim 9, wherein the control circuit determines that there is degradation of the semiconductor device when the difference between the predetermined value and the measured oscillation frequency becomes a first value.

* * * * *